(12) United States Patent
Gan et al.

(10) Patent No.: US 11,552,634 B2
(45) Date of Patent: *Jan. 10, 2023

(54) POWER SEQUENCING IN AN ACTIVE SILICON INTERPOSER

(71) Applicant: Google LLC, Mountain View, CA (US)

(72) Inventors: Houle Gan, Santa Clara, CA (US);
Mikhail Popovich, Danville, CA (US);
Shuai Jiang, Saratoga, CA (US);
Gregory Sizikov, Sunnyvale, CA (US);
Chee Yee Chung, Milpitas, CA (US)

(73) Assignee: Google LLC, Mountain View, CA (US)

( * ) Notice: Subject to any disclaimer, the term of this patent is extended or adjusted under 35 U.S.C. 154(b) by 275 days.

This patent is subject to a terminal disclaimer.

(21) Appl. No.: 16/921,571

(22) Filed: Jul. 6, 2020

(65) Prior Publication Data

US 2021/0036702 A1  Feb. 4, 2021

Related U.S. Application Data

(63) Continuation of application No. 16/527,569, filed on Jul. 31, 2019, now Pat. No. 10,742,211.

(51) Int. Cl.
*H03K 17/68* (2006.01)
*H03K 17/687* (2006.01)
(Continued)

(52) U.S. Cl.
CPC ......... *H03K 17/6871* (2013.01); *G06F 1/263* (2013.01); *H02M 3/07* (2013.01)

(58) Field of Classification Search
CPC ............. H03K 17/063; H03K 17/0822; H03K 17/04123; H03K 2217/0036; H03K 17/687
(Continued)

(56) References Cited

U.S. PATENT DOCUMENTS 7,782,701 B2  8/2010  Seo
9,059,696 B1  6/2015  Rahman
(Continued)

FOREIGN PATENT DOCUMENTS

TW  2016/43772  12/2016

OTHER PUBLICATIONS

Extended European Search Report in European Application No. 20188629.8, dated Nov. 30, 2020, 9 pages.
Authors et al (disclosed anonymously), "Multi power sequencer", IP.com Prior Art Database Technical Disclosure, Oct. 26, 2017, 9 pages.
(Continued)

*Primary Examiner* — Quan Tra
*Assistant Examiner* — Anh-Quan Tra
(74) *Attorney, Agent, or Firm* — Fish & Richardson P.C.

(57) ABSTRACT

An apparatus that includes an interposer, first power connectors that are disposed on a first surface and that receive respective power inputs from one or more power sources, second power connectors that are disposed on the second surface and that receive a respective third power connecter of an integrated circuit when the integrated circuit is mounted on the second surface of the interposer, a plurality of switches formed within the interposer, control circuitry formed within the interposer, and a sequencer circuit coupled to the control input of the control circuitry and that generates a different values for a control input signal that causes the control logic of the control circuitry to generate a corresponding set of switch signals, and the plurality of different values for the control input signal are generated according to a predefined sequence to provide power to the integrated circuit according to power up sequence.

4 Claims, 3 Drawing Sheets

(51) Int. Cl.
*G06F 1/26* (2006.01)
*H02M 3/07* (2006.01)

(58) Field of Classification Search
USPC .................................................. 327/427, 434
See application file for complete search history.

(56) References Cited

U.S. PATENT DOCUMENTS

| | | | |
|---|---|---|---|
| 9,106,229 | B1 | 8/2015 | Hutton |
| 9,692,415 | B2* | 6/2017 | Okamoto ............. H03K 17/693 |
| 9,935,052 | B1 | 4/2018 | Liu et al. |
| 2009/0115256 | A1 | 5/2009 | Flynn et al. |
| 2010/0007000 | A1* | 1/2010 | Kim ...................... H01L 25/105 |
| | | | 257/686 |
| 2010/0194470 | A1 | 8/2010 | Monchiero |
| 2014/0197409 | A1 | 7/2014 | Partsch |
| 2014/0210097 | A1 | 7/2014 | Chen |
| 2015/0081123 | A1 | 3/2015 | Bose et al. |
| 2015/0081125 | A1* | 3/2015 | Bose ..................... G06F 1/3287 |
| | | | 700/291 |
| 2015/0082070 | A1* | 3/2015 | Bose ..................... G06F 1/3287 |
| | | | 713/324 |
| 2015/0269977 | A1* | 9/2015 | Ishizu ................ G11C 14/0054 |
| | | | 365/154 |

OTHER PUBLICATIONS

Kim et al, "Design and Analysis of Interposer-level Integrated Voltage Regulator for Power Noise Suppression in High Bandwidth Memory I/O Interface", IEEE Transactions on Components, Packaging and Manufacturing Technology, 2018, 3 pages.

Kim et al, "Design and Measurement of a Novel On-Interposer Active Power Distribution Network for Efficient Simultaneous Switching Noise Suppression in 2.5-D/3-D IC" IEEE Transactions on Components, Packaging and Manufacturing Technology, 2018, 12 pages.

TW Office Action in Taiwan Application No. 109125275, dated Apr. 6, 2021, 12 pages (with English translation).

* cited by examiner

POWER SEQUENCING IN AN ACTIVE SILICON INTERPOSER

CROSS-REFERENCE TO RELATED APPLICATIONS

This application is a continuation application of, and claims priority to, U.S. patent application Ser. No. 16/527,569, titled "POWER SEQUENCING IN AN ACTIVE SILICON INTERPOSER," filed on Jul. 31, 2019. The disclosure of the foregoing application is incorporated herein by reference in its entirety for all purposes.

BACKGROUND

Large computer, storage, or networking server systems used in datacenters usually consist of a fairly large number of power rails. When a circuit board is powered up, powered off, or going into different power states (such as fault or throttled), all of these rails need to be powered up/down in a specific order for the chips and active components on the board to be functional, or to behave (such as turn on/off, sleep) corresponding to the definition of the power state. This process is called power sequencing which is typically performed by a dedicated component on-board called a sequencer. Typical simpler boards will have one sequencer with pre-programmed firmware that contains the order and delay information which controls the sequencing of all power rails. When the number of power rails become large, more of such devices are needed and they take precious board space, add design complexity, and become hard to manage. In some cases, a "master-slave" configuration of multiple sequencers need to be maintained, further complicating the board level design.

The circuits that are power sequenced include a silicon interposer below the silicon die and above the package substrate for an electrical interface routing between one socket or connection to another. The purpose of an interposer is to spread a connection to a wider pitch or to reroute a connection to a different connection.

SUMMARY

This specification describes technologies relating to systems and methods for integrating a power sequencing circuit into an electrical circuit silicon interposer.

In general, one innovative aspect of the subject matter described in this specification can be embodied in an apparatus including an interposer having a first surface and a second surface that is opposite the first surface, first power connectors that are disposed on the first surface and that receive respective power inputs from one or more power sources, second power connectors that are disposed on the second surface and that receive a respective third power connecter of an integrated circuit when the integrated circuit is mounted on the second surface of the interposer, a plurality of switches formed within the interposer, control circuitry formed within the interposer, and a sequencer circuit coupled to the control input of the control circuitry and that generates the control input signal. Each switch has a first terminal connected to one of the first power connectors, a second terminal connected to one of the second power connectors, and a switch control input that receives a switch signal, wherein when the switch signal is in a first state the switch is in a closed position to electrically connect the first terminal to the second terminal, and when the switch signal is in a second state the switch is in an open position to electrically isolate the first terminal from the second terminal. The control circuitry includes a control input that receives a control input signal a plurality of control outputs, each control output connected to a switch control input and control logic coupled to the control input and the plurality of control outputs, and based on a particular state of the control input signal applied to the control input, generates a corresponding set of switch signals on the control outputs to control the plurality of switches. The sequencer circuit generates a plurality of different values for the control input signal, where each value of the control input signal causes the control logic of the control circuitry to generate a corresponding set of switch signals, and the plurality of different values for the control input signal are generated according to a predefined sequence to provide power to the integrated circuit according to power up sequence.

These and other embodiments can each optionally include one or more of the following features.

In some aspects, the sequencer circuit is included in the integrated circuit, and the interposer includes a core rail connection that is not controlled by a switch and that provides power to a core rail of the integrated circuit, and wherein the sequencer circuit is powered by the core rail.

In some aspects, the sequencer circuit is included in a circuit board upon which the interposer is mounted by the first surface, and the sequencer circuit is connected to a power rail in the circuit board.

In some aspects, the apparatus further includes a circuit board, and a package layer having a first surface and a second surface that is opposite the first surface, wherein the first surface of the package layer is mounted to the circuit board, and the second surface of the package layer is mounted to the first surface of the interposer.

In some aspects, the apparatus further includes a charge pump circuit that boosts an input voltage of a switch signal for a particular switch and provides the boosted input voltage of the switch signal to a switch control input of the particular switch.

In some aspects, the switches are MOSFETs.

Particular embodiments of the subject matter described in this specification can be implemented so as to realize one or more of the following advantages. The benefit of the active interposer circuit arrangement described herein is that each integrated circuit is self-contained in fulfilling its power sequencing requirement. The sequencing requirement can be directly written or changed in the integrated circuit firmware or on-board controller firmware. Additionally, the active interposer circuit arrangement removes multiple power sequencers on the board, creating extra space for additional features and power savings.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

The subject matter of this written description relates to systems and methods for integrating a power sequencing circuit into an circuit device's silicon interposer, such as an application-specific integrated circuits (ASIC's) silicon interposer. This disclosure describes an apparatus that implements power sequencing with logic and delay circuitry in the interposer, and controlled by a controller either in the ASIC or an on-board controller in the circuit board. In the examples below, an ASIC is described, but it is to be understood that other integrated circuits can also benefit from the power sequencing in the silicon interposer.

Modern high-performance ASIC's widely use a silicon interposer below the silicon die and above the package substrate to connect high-speed signals from computer die to memory die or transceiver chips. Silicon interposers are typically made with older technology nodes and are passive. This disclosure proposes an apparatus that implements logic and delay circuitry in the interposer, which is active and functions as in-package power sequencer for the power rails for the ASIC die(s) that are assembled on the interposer.

In one implementation an apparatus includes an interposer, first power connectors that receive respective power inputs from one or more power sources, second power connectors that receive a respective third power connecter of an integrated circuit when the integrated circuit is mounted on the interposer, a plurality of switches formed within the interposer, and control circuitry formed within the interposer. The control circuity includes a control input that receives a control input signal, a plurality of control outputs, each control output connected to a switch control input, and control logic that generates a corresponding set of switch signals on the control outputs to control the plurality of switches.

In some implementations, the sequencing logic is stored in the firmware on the ASIC's integrated controller. The in-package sequencing circuits (e.g., switches) have control signals connected to the ASIC itself. Alternatively, or additionally, in some implementations, the sequencing logic is stored in firmware on an embedded on-board controller on the circuit board, and the sequencing circuits have control signals connected to the on-board controller.

These features and additional features are described in more detail below.

Figure 1:
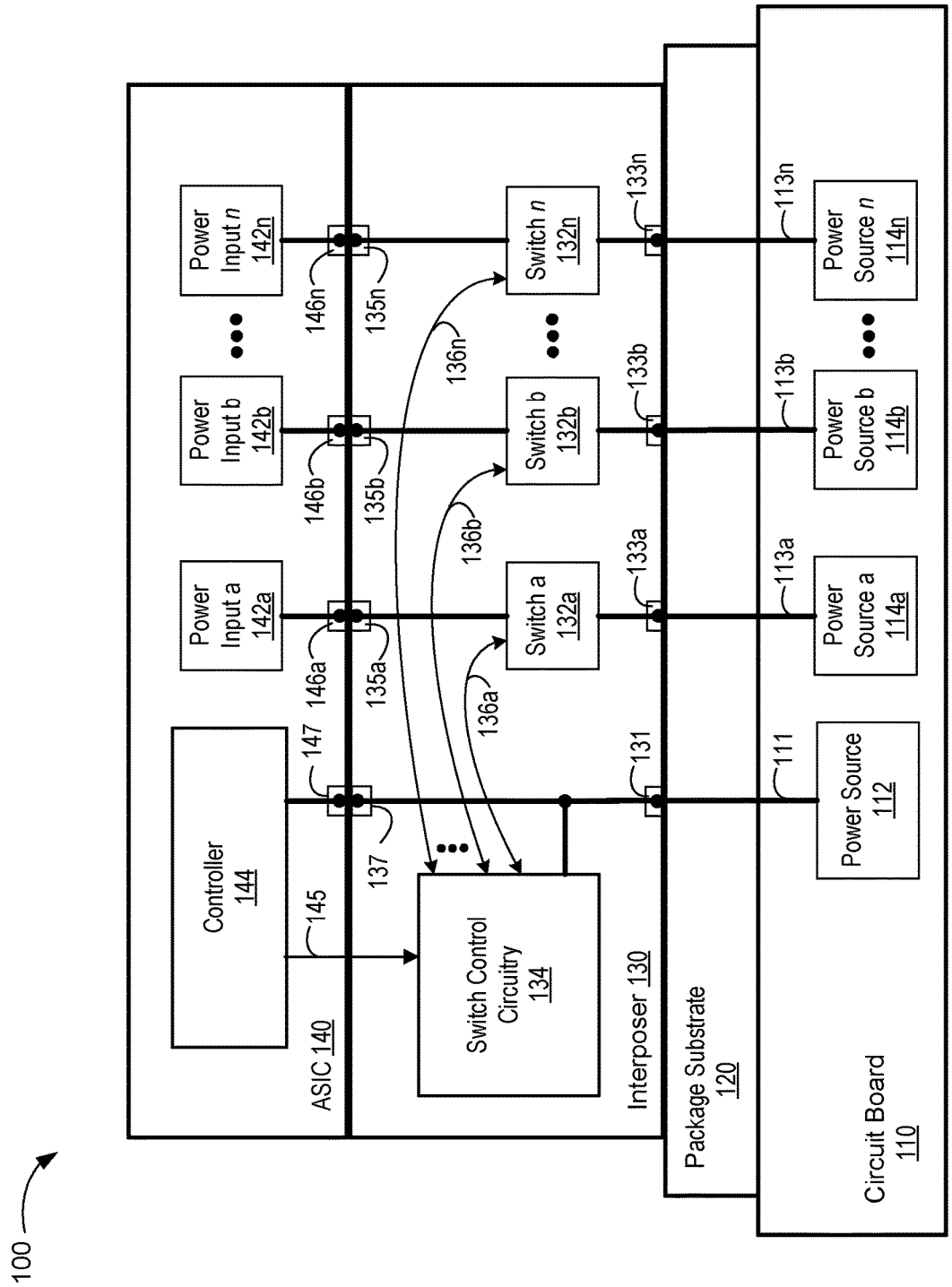
FIG. 1 is a block diagram of an example integrated power sequencing circuit in a silicon interposer.

FIG. 1 is a block diagram of an example integrated power sequencing circuit in a silicon interposer. In particular, FIG. 1 is an example apparatus 100 that includes a sequencer circuit controller 144 located in an ASIC 140 and that controls switch signals for a sequenced power up process. As shown, the apparatus 100 includes a circuit board 110, a package substrate 120, an interposer 130, and an ASIC 140.

The circuit board 110 includes power source 112, which supplies power to a core power rail 111, and power sources 114a, 114b, 114n, etc., which supply power to power rails 113a, 113b, 113n, etc. (hereinafter generally referred to as power rails 113), respectively. Each of the power rails 111 and 113 are electrically connected to power connectors in the interposer 130 through the package substrate 120, as further described herein. As shown in FIG. 1, the presented combination of power rails and power sources is for exemplary purposes only, and is not intended to be limiting in a one-to-one ratio. In some implementations, one power source may provide power to two or more power rails. For example, power source 114a, may provide power to both power rails 113a and 113b, thus, power source 114b would not be necessary.

The interposer 130 electrically couples ASIC 140 to the circuit board 110 through the package substrate 120. The package substrate 120 includes a circuit board-facing side at a first end, and an interposer-facing side at a second end. The package substrate 120 provides the apparatus 100 with a mechanical base support and a form of an electrical interface that allows external components or circuits (e.g., the interposer 130 and ASIC 140) access to the device (e.g., circuit board 110) housed within on the circuit board-facing side of the package substrate 120. In order to electrically connect ASIC 140 and interposer 130 to the circuit board 110, vertical through vias (or other conduction means) are formed in the package substrate 120 and are controlled by switches. The package substrate 120 may be composed of any known used material such as an epoxy-based laminate, resin-based laminate, a polymer material used as a tape substrate, or the like. For example, as shown in FIG. 1, a core power rail 111 is a vertical through via and shown in the vertical direction in the package substrate 120 and interposer 130, but there is a horizontal bifurcation of the core power rail 111 in the interposer 130 in a horizontal direction that provides power to the switch control circuitry 134.

To electrically couple the interposer 130 and ASIC 140 to the circuit board 110, the package substrate 120 may include several layers with metal planes or traces that are interconnected to each other by through-hole plated vias. Thus, the package substrate 120 can include metal conductors that can accomplish this routing function. Additionally, or alternatively, the package substrate 120 includes alternate means of providing an electrical connection such that the power rails 111 and 113 are electrically connected through the package substrate 120 from the circuit board 110 to the interposer 130.

As shown in FIG. 1, the interposer 130 includes switch control circuitry 134 and a plurality of switches 132a, 132b, 132n, (also referred to herein as switches 132). The switch control circuitry 134 includes control logic that generates switch signals 136a, 136b, 136n, etc. (also referred to herein as switch signals 136) to control the switches 132a, 132b, 132n, respectively, in order to control power for each respective power rail 133, as will be discussed in greater detail in connection with FIG. 2.

The interposer 130 further includes a plurality of power connectors 131, 133a, 133b, 133n, etc., on the surface of the substrate-facing side of the interposer 130, and a plurality of power connectors 137, 135a, 135b, 135n, etc., on the surface of the ASIC-facing side of the interposer 130. Each of the power connectors may include microbumps to electrically couple the respective power rails 113 to either the ASIC 140 or the circuit board 110 through the package substrate 120. For example, power connector 131 is electrically coupled to the core power rail 111, and is connected to the package substrate 131 by a microbump. Alternatively, solder bumps may be used for the electrical connections described herein for the plurality of power connectors. Alternatively, microbumps may be used for one particular set of power connectors for the electrical connections, and solder bumps may be used for the electrical connections described herein for a different set of power connectors. For example, the set of power connectors on the substrate-facing side of the interposer 130 (e.g., power connectors 131, 133a-133n) may include solder bumps to electrically connect the interposer 130 to the package substrate 120. Additionally, the set of power connectors on the ASIC-facing side of the interposer 130 (e.g., power connectors 137, 135a-135n) may include microbumps to electrically connect the interposer 130 to the set of power connectors on the interposer-facing side of the ASIC 140 (e.g., power connectors 147, 146a-146n).

The ASIC 140 includes an interposer-facing side at a first end, and an external-facing side at a second end. The ASIC 140 includes components such as a controller 144 and a plurality of power inputs 142a, 142b, 142n, etc. (also referred to herein as power inputs 142). Additionally, ASIC 140 includes a plurality of power connectors 147, 146a, 146b, 146n, etc., on the surface of the interposer-facing side of the ASIC 140 that are able to be electrically connected to the interposer 130.

In the example implementation as shown in FIG. 1, the controller 144 includes a sequencer circuit that generates and sends a control input signal 145 to the control input of the switch control circuitry 134 in the interposer 130. A plurality of different values are generated for the control input signal, where each value of the control input signal 145 causes the control logic of the switch control circuitry 134 to generate a corresponding set of switch signals 136 to control each of the switches 132. For example, the plurality of different values for the control input signal 145 are generated by the controller 144 according to a predefined sequence to provide power to the ASIC 140 according to power up sequence. The switches 132 turn on and off the individual power rails 113 to the power inputs 142 of the ASIC 140. The timing of the control signals and the power gate switching delay are designed such that the sequencing can meet with the particular specification of the ASIC 140. Thus, a different ASIC 140 with different power up sequencing instructions for the power inputs 142 can be coupled to the switch control circuitry 134 of the interposer 130 and provide a different power up sequence event for the particular ASIC.

Figure 2:
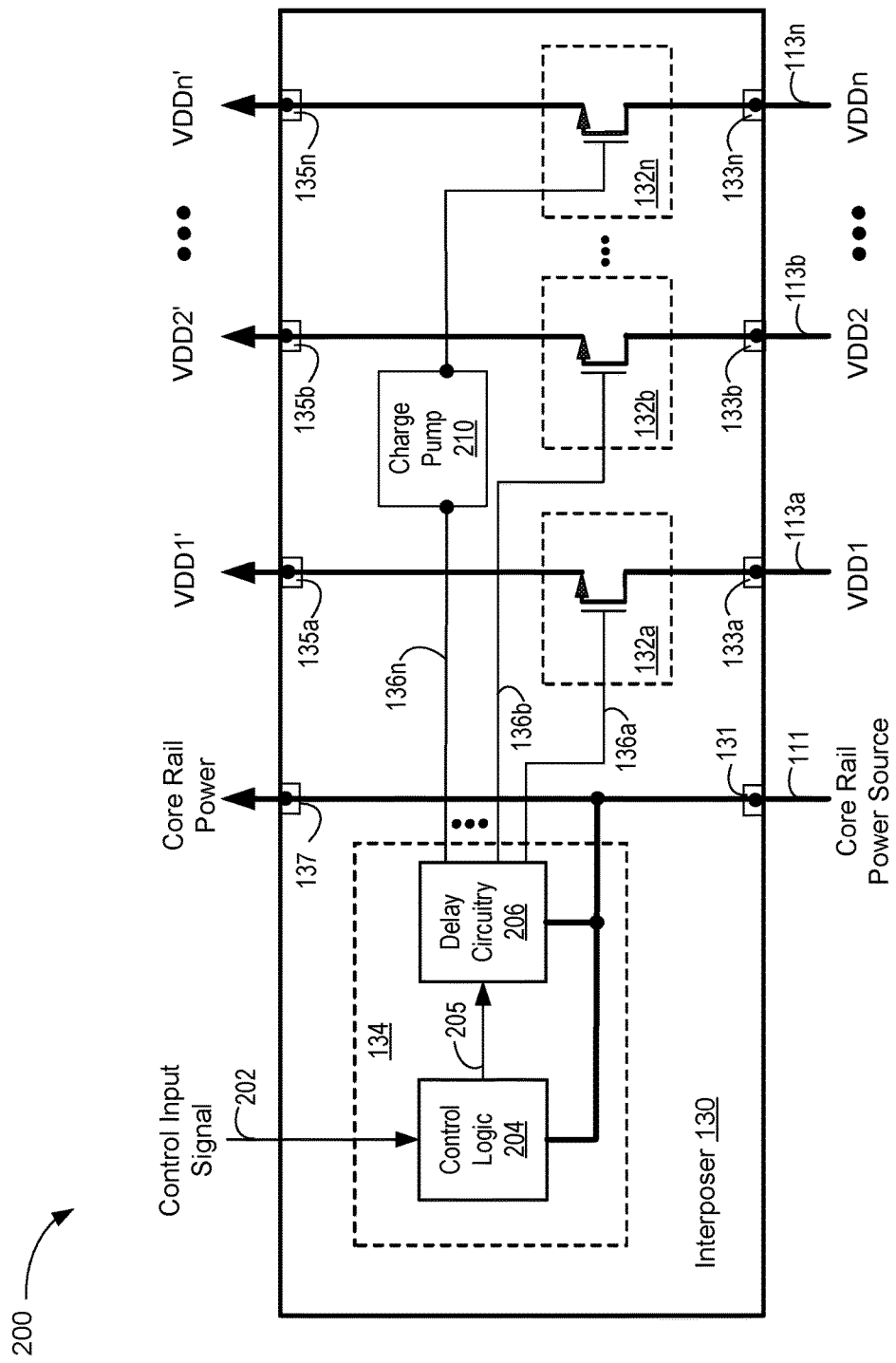
FIG. 2 is an example circuit arrangement of an active silicon interposer.

FIG. 2 is an example circuit arrangement 200 of an active silicon interposer, such as interposer 130 of FIG. 1. In this example circuit arrangement 200, interposer 130 is receiving power on the substrate-facing side of the interposer 130 from a core rail power source for the core power rail 111, as well as receiving power from other input power sources VDD1, VDD2, VDDn, etc., for the sequencing power rails 113a, 113b, 113n, etc., respectively. Additionally, the interposer 130 is operable to providing power output on the ASIC-facing side of the interposer 130 for core rail power for the core power rail 111, as well as providing output power VDD1', VDD2', VDDn', etc., to other components for the sequencing power rails 113a, 113b, 113n, etc., respectively.

The switch control circuitry 134 includes control logic 204 and delay circuitry 206. The control logic 204 and delay circuitry 206 each include a power input to receive the core power from the core power rail 111. The controller 144 also receives power from the control core power rail 111, and thus is not required to be "switched on." The control logic 204 includes a control input that receives a control input signal 202 (e.g., control input signal 145 from FIG. 1) that is received by the switch control circuitry 134 from a sequencer circuit (e.g., controller 144 of the ASIC 140, or an on-board controller on the circuit board 110 as further described herein with reference to FIG. 3). The controller 144 generates control signals so that that ASIC 140 may be powered up according to a controlled power sequence, e.g., rails may be powered in a specific pre-defined sequence that ensures the ASIC 140, once completely powered up, will operate according to specification and without power-induced errors. The control logic 204 provides an output signal 205 to an input of the delay circuitry 206. The delay circuitry then generates the switch signals 136a, 136b, 136n, etc., for each respective switch 132a, 132b, 132n, etc., according to a power sequencing process received in the control input signal 202. The switch signals 136 include a first state and a second state. For example, when the switch signal is in a first state, the switch is in a closed position to electrically connect the first terminal to the second terminal, and when the switch signal is in a second state the switch is in an open position to electrically isolate the first terminal from the second terminal. The control logic can be implemented by any appropriate control circuitry that provides switch signals for switches.

The switches 132 in the example embodiment are MOS-FETS, however, different types of switches may be used. As shown in FIG. 2, each switch 132a, 132b, 132n includes a first terminal, a second terminal, and a third terminal. The third terminal of the each switch receives a control signal that places the first switch in either a closed state in which a conduction path is established between the first and second terminals, or an open state in which the conduction path is eliminated between the first and second terminals. The switches 132, or referred to as power gates, turn on and off individual power rails. For example, switch 132a is used to switch the power on and off from the power rail 113a (e.g., VDD1) from the power connector 133a on the substrate-facing side of the interposer 130 to the power connector 135a on the ASIC-facing side of the interposer 130. In operation, during an on state, switch 132a receives switch signal 136a at the third terminal of the switch 132a that places the switch 132a in a closed state in which a conduction path is established between the first and second terminals of switch 132a, and the output power VDD1' is now provided as an output from the power connector 135a to a connecting device, such as ASIC 140 in FIG. 1. During an off state, switch 132a receives switch signal 136a at the third terminal of the switch 132a that places the switch 132a in an open state in which the conduction path is eliminated between the first and second terminals of switch 132a, and the power VDD1 is now prohibited as an output from the power connector 135a to a connecting device, such as ASIC 140 in FIG. 1.

In some implementations, the interposer 130 includes one or more charge pumps used to elevate the driving voltage of the switch signals 136 and fully open the switches 132. For example, as shown in FIG. 2, charge pump 210 is connected to switch signal 136n. In operation, the charge pump 210 can boost the voltage for the switch signal 136n in order to provide a voltage that enables switch 132n is fully open to provide the expected power from the power rail 113n (VDDn) to a component that is electrically connected to the ASIC-facing side of the interposer 130, such as ASIC 140 in FIG. 1. Thus, the charge pump 210 ensures that the input power received at power connector 133n (VDDn) is substantially similar to the output power at power connector 135n (VDDn').

Figure 3:
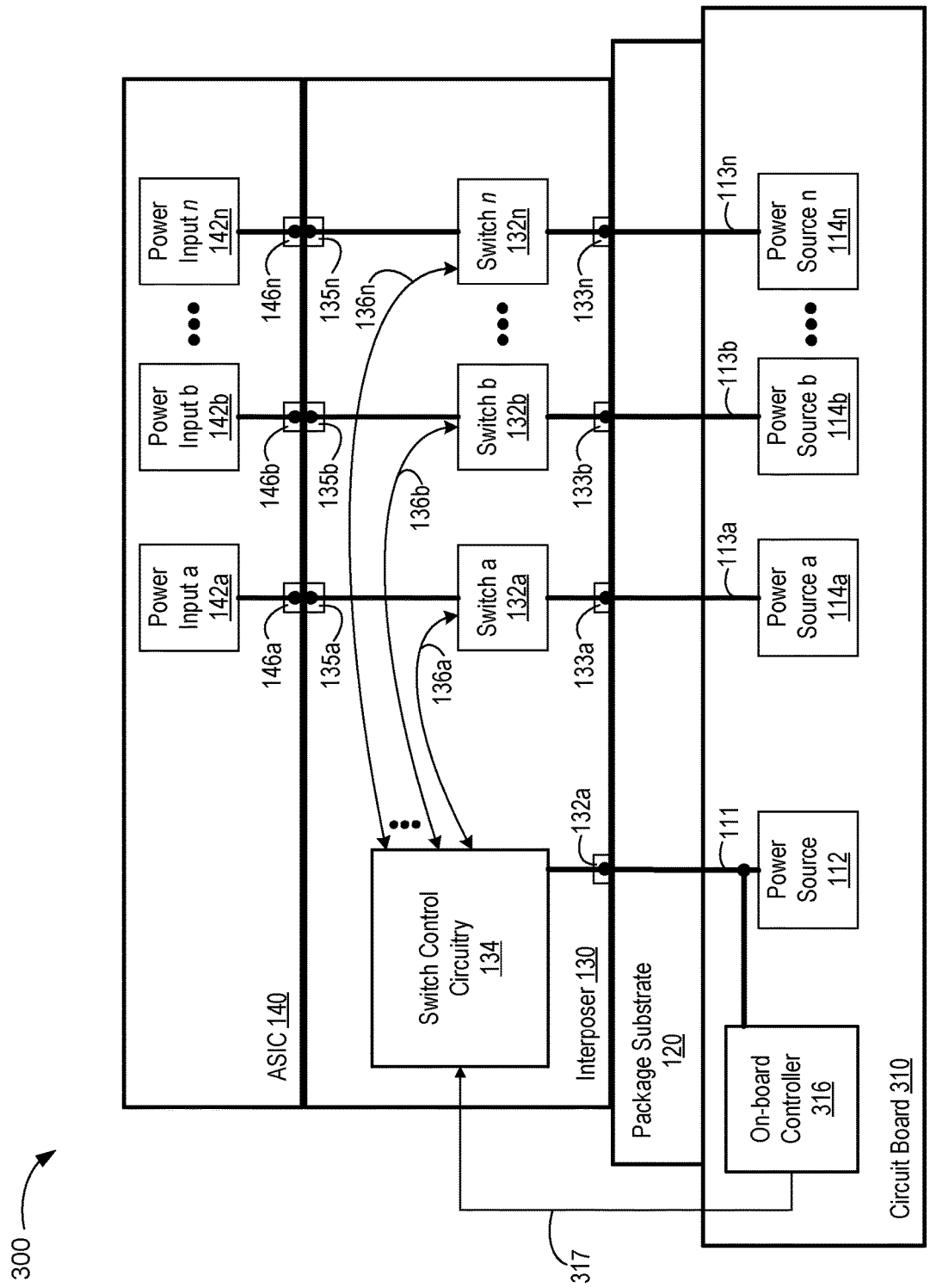
FIG. 3 is a block diagram of another example integrated power sequencing circuit in a silicon interposer.

FIG. 3 is a block diagram of an example integrated power sequencing circuit in a silicon interposer. In particular, FIG. 3 is an example apparatus 300 includes a sequencer circuit that controls switch signals through a controller on a circuit board. The apparatus 300 has a topology similar to apparatus 100 shown in FIG. 1, except that an on-board controller 316 on the circuit board 310 provides the control input signal 317 to the switch control circuitry 134, instead of the control input signal 145 from the controller 144 of the ASIC 140 as in FIG. 1.

As shown in FIG. 3, the on-board controller 316, also referred to as a sequencer circuit, is electrically connected to core power rail 111 from the power source 112. The core power rail is typically the first rail from the circuit board 310, and is also the first rail to turn on in the power rail sequencing process, and powers the integrated chip manager inside the on-board controller 316, which then executes the chip firmware, communicates with the switch control circuitry 134, and manages the rest of the sequencing process, as described herein.

Embodiments of the subject matter and the operations described in this specification can be implemented in digital electronic circuitry, or in computer software, firmware, or hardware, including the structures disclosed in this specification and their structural equivalents, or in combinations of one or more of them. Embodiments of the subject matter described in this specification can be implemented as one or more computer programs, i.e., one or more modules of computer program instructions, encoded on computer storage medium for execution by, or to control the operation of, data processing apparatus.

While this specification contains many specific implementation details, these should not be construed as limitations on the scope of any features or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. An apparatus, comprising:
   an interposer having a first surface and a second surface that is opposite the first surface;
   first power connectors that are disposed on the first surface and that receive respective power inputs from one or more power sources;
   second power connectors that are disposed on the second surface and that receive a respective third power connecter of an integrated circuit when the integrated circuit is mounted on the second surface of the interposer;
   a plurality of switches formed within the interposer, wherein each switch has a first terminal connected to one of the first power connectors, a second terminal connected to one of the second power connectors, and a switch control input that receives a switch signal, wherein when the switch signal is in a first state the switch is in a closed position to electrically connect the first terminal to the second terminal, and when the switch signal is in a second state the switch is in an open position to electrically isolate the first terminal from the second terminal;
   wherein the interposer includes a core rail connection that is not controlled by a switch and that provides power to a core rail of the integrated circuit;
   control circuitry included in one of the integrated circuit or a circuit board upon which the interposer is mounted by the first surface, the control circuitry including:
      a control input that receives a control input signal;
      a plurality of control outputs, each control output connected to a switch control input; and
      control logic coupled to the control input and the plurality of control outputs, and based on a particular state of the control input signal applied to the control input, generates a corresponding set of switch signals on the control outputs to control the plurality of switches; and
   a sequencer circuit included in the integrated circuit and powered by the core rail, the sequencer coupled to the control input of the control circuitry and that generates the control input signal, wherein the sequencer circuit generates a plurality of different values for the control input signal, where each value of the control input signal causes the control logic of the control circuitry to generate a corresponding set of switch signals, and the plurality of different values for the control input signal are generated according to a predefined sequence to provide power to the respective third power connectors of the integrated circuit according to power up sequence to completely power up the integrated circuit in a sequence that ensures the integrated circuit, once completely powered up, operates according to specification and without power induced errors.

2. The apparatus of claim 1, further comprising:
   a circuit board; and
   a package layer having a first surface and a second surface that is opposite the first surface, wherein the first surface of the package layer is mounted to the circuit board, and the second surface of the package layer is mounted to the first surface of the interposer.

3. The apparatus of claim 1, further comprising a charge pump circuit that boosts an input voltage of a switch signal for a particular switch and provides the boosted input voltage of the switch signal to a switch control input of the particular switch.

4. The apparatus of claim 1, wherein the switches are MOSFETs.

* * * * *